US008194408B2

(12) United States Patent
Chou et al.

(10) Patent No.: US 8,194,408 B2

(45) Date of Patent: Jun. 5, 2012

(54) SLIDING SLEEVE USB

(76) Inventors: Peter Chou, Fountain Valley, CA (US); Kam Chin, Fountain Valley, CA (US); Shing Tarn, Fountain Valley, CA (US)

( * ) Notice: Subject to any disclaimer, the term of this patent is extended or adjusted under 35 U.S.C. 154(b) by 601 days.

(21) Appl. No.: 12/291,934

(22) Filed: Nov. 15, 2008

(65) Prior Publication Data

US 2010/0124831 A1 May 20, 2010

(51) Int. Cl.
*H05K 1/14* (2006.01)
*H05K 5/00* (2006.01)

(52) U.S. Cl. ........................................ 361/737; 361/752

(58) Field of Classification Search .................. 361/730, 361/737, 752

See application file for complete search history.

(56) References Cited

U.S. PATENT DOCUMENTS

| | | | | |
|---|---|---|---|---|
| 6,213,395 | B1 * | 4/2001 | Dejaeger et al. | 235/383 |
| 6,456,500 | B1 * | 9/2002 | Chen | 361/752 |
| 6,676,419 | B1 * | 1/2004 | Lin et al. | 439/76.1 |
| 6,743,030 | B2 * | 6/2004 | Lin et al. | 439/131 |
| 6,763,410 | B2 * | 7/2004 | Yu | 710/74 |
| 6,792,487 | B2 * | 9/2004 | Kao | 710/74 |
| 6,808,400 | B2 * | 10/2004 | Tu | 439/131 |
| 6,979,210 | B2 * | 12/2005 | Regen et al. | 439/131 |
| 7,004,780 | B1 * | 2/2006 | Wang | 439/353 |
| 7,035,110 | B1 * | 4/2006 | Wang et al. | 361/737 |
| 7,125,265 | B2 * | 10/2006 | Weng | 439/131 |
| 7,153,148 | B2 * | 12/2006 | Chen et al. | 439/141 |
| 7,179,099 | B2 * | 2/2007 | Hsieh | 439/131 |
| 7,303,411 | B1 * | 12/2007 | Morganstern et al. | 439/131 |
| D602,026 | S * | 10/2009 | Lo | D14/480.7 |
| D620,017 | S * | 7/2010 | Lo | D14/480.7 |
| 7,762,470 | B2 * | 7/2010 | Finn et al. | 235/492 |
| 7,771,215 | B1 * | 8/2010 | Ni et al. | 439/131 |
| 7,869,219 | B2 * | 1/2011 | Ma et al. | 361/737 |
| 2004/0212966 | A1 * | 10/2004 | Fisher et al. | 361/726 |
| 2006/0131431 | A1 * | 6/2006 | Finn | 235/492 |
| 2006/0211283 | A1 * | 9/2006 | Weng | 439/131 |
| 2006/0288169 | A1 * | 12/2006 | Steiner | 711/115 |
| 2007/0015407 | A1 * | 1/2007 | Loftus | 439/607 |
| 2007/0127223 | A1 * | 6/2007 | Mitsuhashi | 361/752 |
| 2008/0233776 | A1 * | 9/2008 | Tang et al. | 439/131 |
| 2008/0261450 | A1 * | 10/2008 | Nguyen et al. | 439/607 |
| 2010/0124831 | A1 * | 5/2010 | Chou et al. | 439/131 |

FOREIGN PATENT DOCUMENTS

WO WO 2008129814 A1 * 10/2008

* cited by examiner

*Primary Examiner* — Lisa Lea Edmonds
*Assistant Examiner* — Xanthia C Cunningham
(74) *Attorney, Agent, or Firm* — Clement Cheng

(57) ABSTRACT

An electronic device having a USB connector is provided comprising a partial outer sleeve reaching short of the USB connector and securely holding thereof and a shorter inner sleeve extending little over the USB connector and partially housed in the outer sleeve in a sliding relationship. The USB connector is connected to functional circuit on at least one printed circuit board. A short piece of adaptor bracket permits the selected printed circuit board fastened in a uniform profile to the containing space of the outer sleeve so that a determined size of outer sleeve may hold a variety of printed circuit boards in a constantly acceptable tolerance.

16 Claims, 5 Drawing Sheets

SLIDING SLEEVE USB

BACKGROUND OF THE INVENTION

A. Field of the Invention

The present invention relates to an electronic device. More particularly, the present invention relates to a portable device with a telescoping sleeve for protecting a USB connector in a compact format.

B. Description of the Prior Art

Portable electronic devices often have built-in connectors for connection to a host such as a personal computer. USB drives are popular types of memory drives. A USB flash drive is a pocket sized NAND-type flash memory data storage integrated with a USB connector for connection with a computer or other information hosts for stored data exchange. The USB drives are generally a short stick shape extending a few inches in length. Internally, they comprise a circuit board for mounting a NAND flash memory chip, a USB mass storage controller, a crystal oscillator on either surfaces of the circuit board and a USB connector mounted on and protruding from an edge of the circuit board. Additionally, the USB drives may have an LED for indicating data transfer, data read and data write.

A protective casing typically encloses the USB drive except for the USB connector portion. The casing normally has a single physical size per model regardless of memory size. Conventional USB drives may also have unpopulated space for a future second memory chip while allowing a manufacturer to keep only one type of PCB for various models with different storage sizes according to market needs. To keep both the USB drive casing and the PCB components universal for different capacities, the size should not become larger than necessary and the USB drives are preferred to be as small as possible.

For protection of the USB connector from static electricity or other physical damage, the casing typically has a cover for the connector portion. Some have a dielectric plastic cap removably coupled with the drive casing over the connector. The cap may be designed to remain attached to the casing body such as by making it swivel away from the connector during operation. Others employ linearly retractable connector. However, these prior art connection methods only add bulkiness to the USB devices during use because the connector needs to be extended from the casing for operation. When a USB device has to be remained connected to a portable host like a small laptop computer, conventional bulging cases become more difficult to use.

Therefore, an object of the present invention is to provide a reduced dimension of USB connection devices inside a smaller yet universal casing for holding various PCB components of different capacities. Another object of the present invention is to provide a durable and compact sleeve for a USB drive.

SUMMARY OF THE INVENTION

The electronic devices of the present invention commonly have a USB connector to protect. The structure includes a partial outer sleeve reaching short of the USB connector. The outer sleeve has a generally rectangular upper shell and preferably a symmetrically shaped lower shell extending in parallel with the upper shell. Each shell preferably has two adjacent edge walls erected toward the opposing shell to mate and securely hold a containing space left open at front and lateral sides, each shell further having a support wall extending in parallel with the lateral side but terminating ahead of the front open side. The support wall includes an inwardly facing slide rail part that combines with the opposing slide rail part to form a closed double side rail, and the lower shell further includes an interlocking means. Connected to the USB connector is a functional circuit on at least one printed circuit board selected among differentially configured group. In order to accept the different circuit configurations, a short piece of swappable adaptor bracket is used to fasten the selected printed circuit board in a uniform profile to the containing space of the outer sleeve in a constantly acceptable tolerance. The adaptor bracket has a locking means for engaging the interlocking means of the lower shell. Directly enveloping the USB connector, a shorter inner sleeve extends little over the USB connector and is partially housed in the outer sleeve in a sliding relationship through the front and lateral open sides. The inner sleeve has a front aperture for passing the USB connector and defining an elongated thumb grip adapted to slide along the closed double side rail between a front end position to cover the USB connector completely and a rear end position to expose the entire USB connector.

An indicating means is also provided to tell the activated state of the electronic device. It preferably includes an LED installed on the printed circuit board to illuminate upon receiving an active signal generated by the functional circuit. In addition, the inner shell has a separate cover plate that is clear or semitransparent to propagate the illumination and an opening through the upper shell.

To provide a controlled sliding operation, there is a limiting means including an inwardly shifted positioning of the support walls of the outer sleeve, a T-shaped slider protruding from an interior surface of the elongated thumb grip of the inner sleeve and normally lying out of engagement with the slide rail part before the thumb grip is pushed into reengagement under bias, a trough formed on each support wall of the outer sleeve to the inwardly of and along the slide rail part, and two opposite recesses formed at the ends of each slide rail part so as to communicate with the adjacent trough, whereby the T slider of the inner sleeve is slidably captured by the closed double side rail and resiliently locks into position when the inner sleeve is in either the front and rear end positions.

A linear sliding means for securing smooth and reliable movements between the inner and outer sleeves includes a pair of parallel grooves formed respectively on the interior surfaces of the lower shell and upper shell of the outer sleeve near the front open side and two pairs of embossed sliders formed on upper and lower surfaces of the inner sleeve and slidably received in the outer sleeve grooves.

The thumb grip of the inner sleeve has an indentation to enhance the grip force by a user's finger during the sliding elongation and contraction with respect to the outer sleeve and thus the USB connector.

Embodiments of the invention will now be described by way of example with reference to the accompanying drawings.

DETAILED DESCRIPTION OF THE PREFERRED EMBODIMENT

Figure 1:
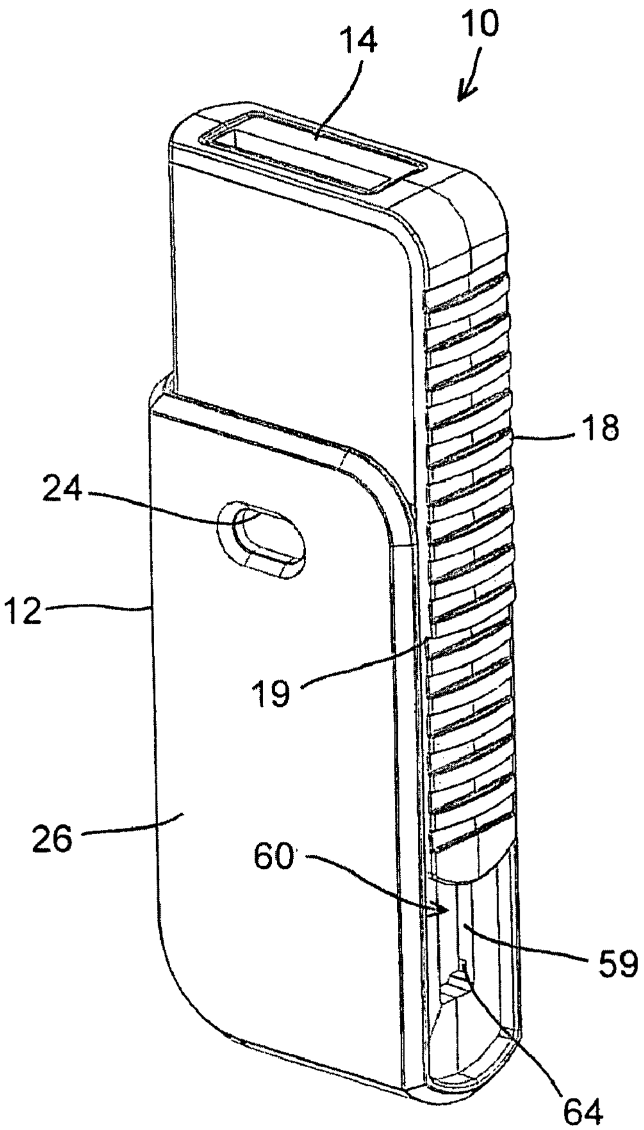
FIG. 1 is a perspective view of a sliding sleeve electronic device according to the present invention wherein an inner connector sleeve and an outer base sleeve are moved away from each other to expansively cover a USB connection internally fixed to the base sleeve.
Figure 2:
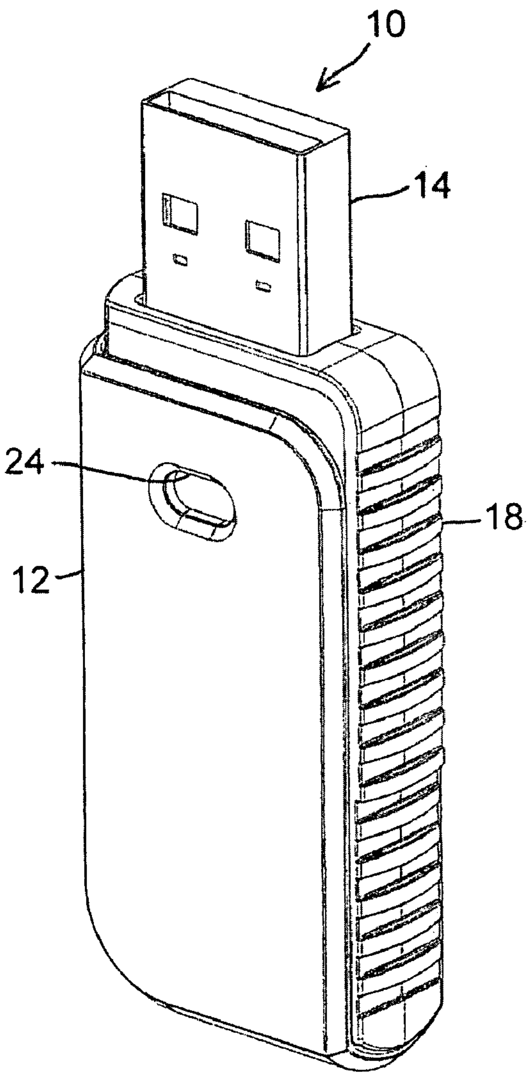
FIG. 2 shows the electronic device reduced by the sliding sleeve moved inside the base sleeve in an active mode to connect the device through the USB connection.

With reference to FIGS. 1 and 2, a portable electronic device 10 is shown in an upright posture having an outer base sleeve 12 and a USB electrical connector or plug 14 fixedly mounted internally on base sleeve 12. Interposed between sleeve 12 and USB plug 14 is an inner sleeve 16 having a thumb grip 18 overhanging outer sleeve 12 and adapted to slide longitudinally of device 10. The outside sleeve 12 as an opening at a top end. In a user's hand, two sleeves 12 and 16 may slide freely with respect to each other between their extreme positions shown respectively in FIGS. 1 and 2. Inner sleeve 16 normally encloses USB plug 14 for protection and pulled back to overlap outer sleeve 12. Thumb grip 18 of sliding sleeve 16 extends longitudinally and has an indenture across the width thereof to enhance grip by a user's thumb forward and aft against base sleeve 12 held by the rest of the hand. Thumb grip 18 may have a stepped section 19 at approximately midlevel of device 10 where the thumb is placed to enhance traction for sliding sleeves 12, 16 for engaging and disengaging the releasable latch engagement formed between the inside sleeve and the outside sleeve.

Therefore, inner sleeve 16 intermeshes with outer base sleeve 12 in a diametrically opposite posture so that they cooperatively form a rectangular box, which expands and retracts into itself through smooth sliding movements of two sleeves 12 and 16 with respect to each other in a short single pitch corresponding to the length of USB plug 14. Sleeves 12 and 16 slide with respect to each other by a sidewise touch of device 10 to avoid an interference with a comfortable grasp thereof by the user but provide a full-length easy grip of inner sleeve 16 with a thumb for sheathing and unsheathing USB plug 14.

Figure 3:
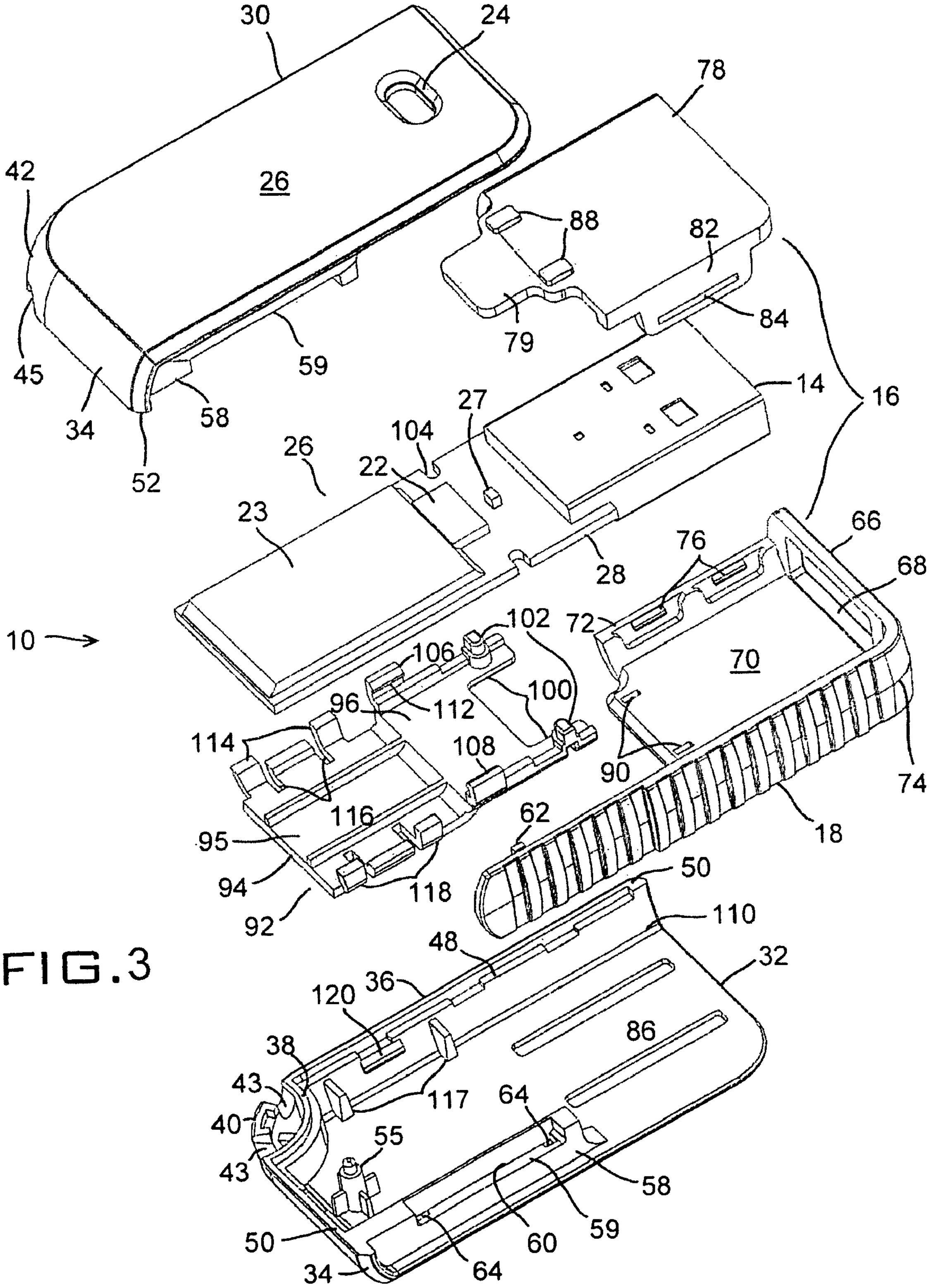
FIG. 3 is a fully exploded perspective view of the electronic device.

Turning to FIG. 3, USB plug 14 is electrically connected edgewise to a circuit board 20, which supports memory components represented by blocks 22 and 23. The circuit board is a type of circuit device. Electronic device 10 may be one of a variety of small portable units including a flash memory device, modem, and MP3 player. Also, the sleeve construction of the present invention may be applied to protect any USB plugs attached to various electrical components such as a USB cable for directly connecting to a host that may be a personal computer. Base sleeve 12 may have a viewing opening 24 at a top surface 26 that will usually face the user during handling of memory device 10. When inner sleeve 16 is retracted as in FIG. 2, opening 24 may be aligned with an LED lamp 27 connected to illuminate an active light and inform that memory device 10 is actively connected to the host. In addition to thumb grip 18, top opening 24 may help the user hold device 10 in the correct position for connecting to a USB socket of the host in the first place before an indication light is on. This may facilitate alignment of the USB plug 14 with respect to different hosts with vertically or horizontally positioned sockets.

As individually illustrated in the exploded view, components of electronic device 10 comprises a main assembly 28 of blocks 22 and 23 on circuit board 20 with USB plug 14 welded to its front end, outer sleeve 12 of an upper shell 30 and a lower shell 32 both of which have a rectangular shape generally in a mirror image to each other. Other than the opening 24 through upper shell 30 and their mating edges against each other, shells 30 and 32 have identical features. Each of the shells 30, 32 has an erect rear wall 34 and a lateral sidewall 36 joined to rear wall 34 via an inwardly curved corner 38. In molding shells 32, 30 with plastic, corners 38 may be formed in an inward curvature with outwardly protruding round walls 40, 42 respectively. Round wall 40 of lower shell 32 may have two semicircular cutouts 43 at either sides and round wall 42 of upper shell 30 similarly has two cutouts 45 so that a pair of eyelets 46 is formed to thread a lanyard when shells 30 and 32 are assembled together, as shown clearly in FIG. 8. To reinforce eyelets 46, lower round wall 40 may be partially depressed while upper round wall 42 is prominently shaped to make a positive coupling with round wall 40 as shown in FIG. 5 where lower shell 32 is turned over to reveal the interior of both shells 30 and 32.

Figure 5:
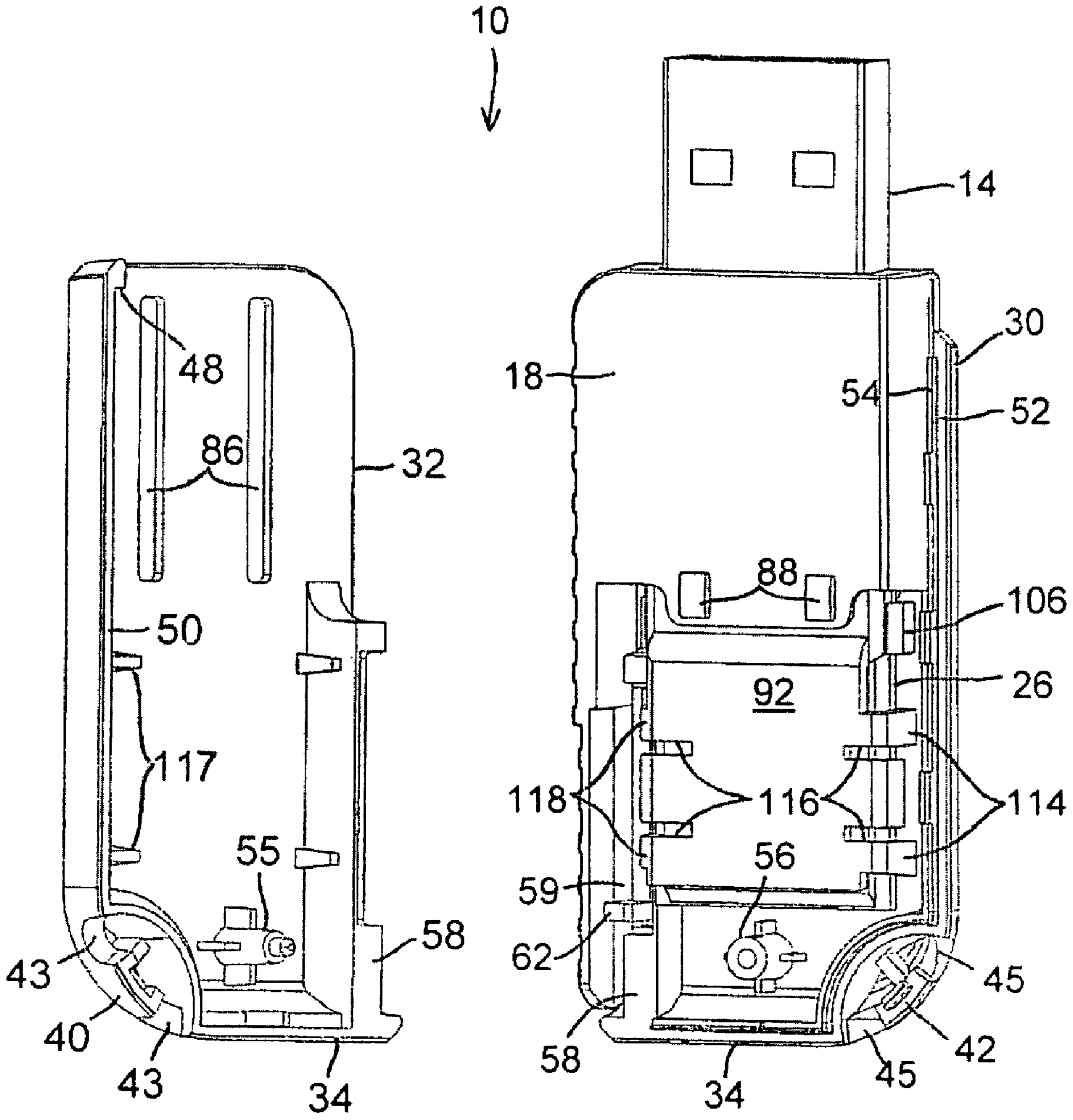
FIG. 5 is a bottom perspective view of the electronic device with a lower shell detached and flipped to show the mating interior of the electronic device.

Further in FIGS. 3 and 5, the respective shells 30, 32 have complimentarily shaped mating ends, of which a female end is clearly visible in lower shell 32 with contoured cutouts 48 extending along a top plain surface 50 along rear wall 34, corner 38 and sidewall 36. Conversely, upper shell 30 has a flat surface 52 with a male end of complementarily formed ridges 54 facing plain surface 50 of lower shell 32. During assembly of two shells 30 and 32 ridges 54 mate with cutouts 48 to hold shells 30, 32 together longitudinally. To reinforce the assembly of shells 30 and 32, an anchor post 55 may be formed on lower shell 32 integrally erected upright toward upper shell 30, which has a columnar seat 56 for receiving post 55.

Figure 4:
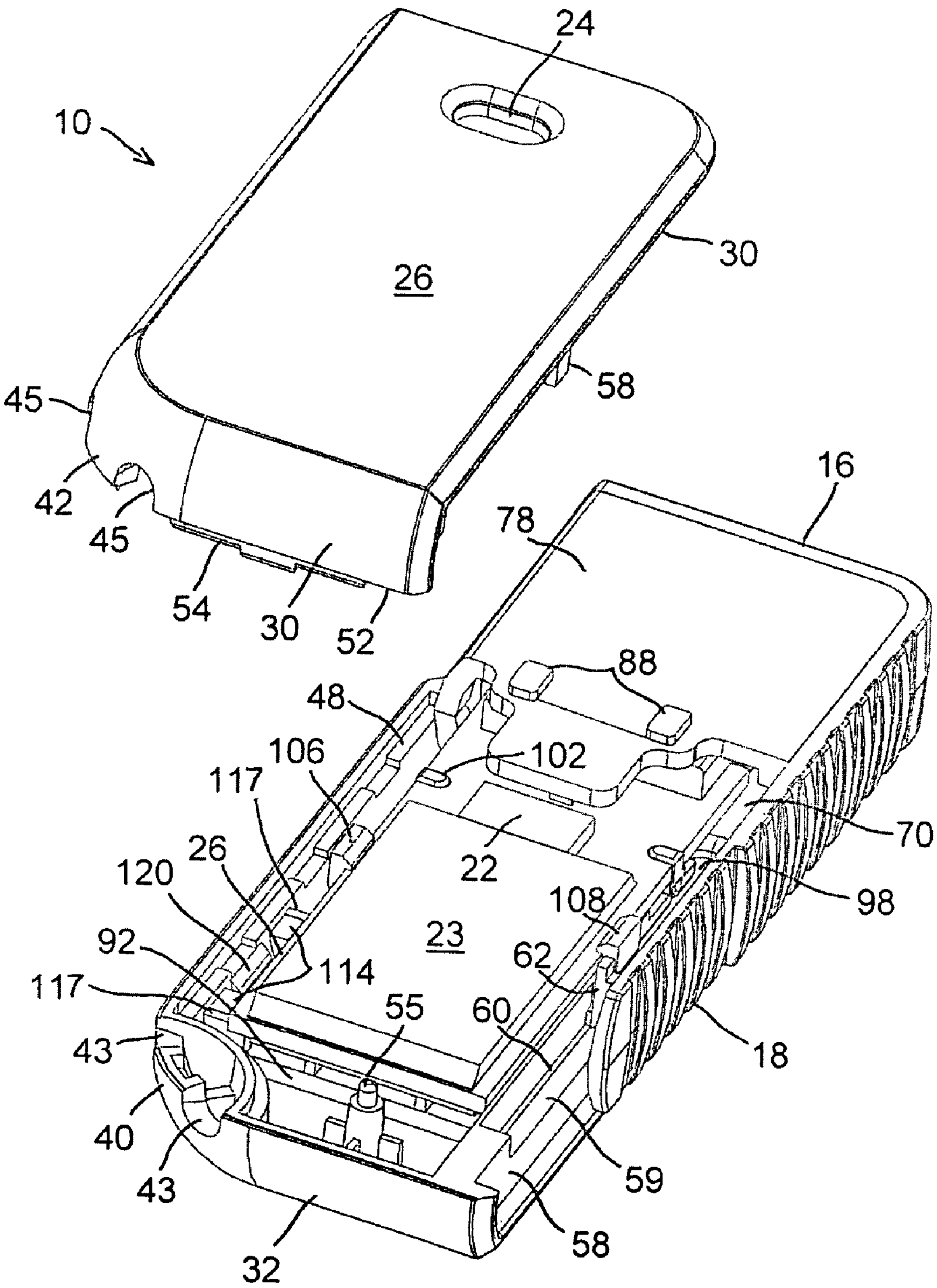
FIG. 4 is a plan perspective view of the assembled electronic device with an upper shell detached to show the sliding coupling of the thumb sleeve therewith.

Distally extending from rear walls 34 of shells 30, 32 in parallel with sidewalls 36 are support walls 58 that join together in assembly. A trough 60 is formed longitudinally from top regions of the respective support walls 58 to their bottoms to define slide rails 59, which are also recessed to about the midlevel of support walls 58 (see FIG. 3). Inner sleeve 16 has on its interior side an integral T-shaped slider 62, which is normally located near a front end of slide rail 59 so that slider 62 shuttles to and from the opposite rear end of slide rail 59. In order to provide temporary stops of slider 62 and thus holds of the outer and inner sleeves 12, 16 at their relative extreme positions, each slide rail 59 may have two end recesses 64, into which a tip of slider 62 is lightly received before it is forced back onto slide rail 59 by a finger push. To this end, thumb grip 18 may be positioned relative to slide rails 59 so that slider 62 is biased inwardly of end recess 64. FIG. 4 shows thumb grip 18 in its natural state out of trough 60 before it is pressed into engagement with slide rail 59 under bias during assembly.

Inner sleeve 16 may also have an exit gate 66, which extends forwardly of thumb grip 18 at right angle and has a large aperture 68 in which the front area of USB plug 14 rests and lies flush with the outer surface of gate 16 when inner sleeve 16 is at its guard up position. As inner sleeve 16 slides closing in outer sleeve 12, gate 66 easily glides down longitudinally along the circumferential surfaces of USB plug 14. Between thumb grip 18 and gate 66 a rectangular base plate 70 extends to partially cover USB plug 14. Base plate 70 extends to an upright end wall 72 at the same level to a middle parting line 74 of inner sleeve 16 and has two engraved protruding latches 76. Thus, thumb grip 18, gate 66 and end wall 72 together form a rectangular open space for snuggly accommodating USB plug 14, which is then covered by a cover plate 78. Cover plate 78 may be made of a clear or lightly colored plastic and is dimensioned at its three sides to tightly fit the combined shape of thumb grip 18, gate 66 and end wall 72. Further, cover plate 78 has a rectangular overhang 79 on or above an LED 80 on circuit board 20 so that an activation light of LED 80 may project evenly through overhang 79. Thus, the user may check the light through opening 24 of upper shell 30. Alternatively, overhang 79 may be selectively colored to add a custom shade to the LED indication. Optionally, cover plate 78 may be colored independently by an opaque dye on the exterior surface to visually match the overall tone of device 10.

Cover plate 78 also has two parallel slotted arms of which one is shown at 82 where an elongated slot 84 will be interlocked with a third latch (not shown) projecting from the interior of inner sleeve 16 facing opposite to latches 76. By simply pressing cover plate 78 onto base plate 70, inner sleeve 16 may be completed. In order to keep the sliding movement between inner sleeve 16 and outer sleeve 12 constantly linear, two pairs of rail means are provided wherein a pair of parallel longitudinal grooves 86 are formed respectively on upper and lower shells 30, 32 of outer sleeve 16 in their interior surfaces. On the other hand, base plate 70 and cover plate 78 of inner sleeve 16 respectively have two low sliders 88 embossed outwardly to enter and slide along grooves 86. The figures show the upper visible sides of components only but upper shell 30 has grooves similar to the grooves 86 on lower shell 32 at the corresponding positions and likewise base plate 70 has outwardly protruding sliders similar to sliders 88 under dimple marks 90.

Mounting main assembly 28 on lower shell 32 is accomplished through an adaptor tray 92, which is located right behind base plate 70 to fasten main assembly 26 to lower shell 32. Adaptor tray 92 has a main plate 94 for adaptively filling a clearance formed between a generally plain interior surface of lower shell 32 and a certain surface profile of electrical parts of main assembly 28. The adapter tray preferably snaps together with the circuit. The circuit is formed as a printed circuit board. Thus, main plate 94 has a contoured surface profile 95 to fit the underside of circuit board 20. Extending from main plate 94 at an elevated position is a mount section 96 for circuit board 20. Due to the independent piece of adaptor tray 92 from base plate 70, a particular design of sliding structure of the invention can universally hold different electronic configurations of main assembly 26 resulting in more applications to realize than otherwise possible.

Referring also to FIG. 4, main plate 94 of adaptor tray 92 is sandwiched between the lower underside of main assembly 28 and lower shell 32 while mount section 96 of tray 92 is fixed to circuit board 20 leaving a wide cavity 98 underneath in which base plate 70 freely moves as inner sleeve 16 slides toward and away from both shells 30, 32 of outer sleeve 12. Due to the stepped structure of adaptor tray 92, USB plug 14 of main assembly 28 can be firmly centered in aperture 68 of inner sleeve 16.

Mount section 96 has a fastening means including two upper side arms 100, which have upright posts 102 respectively to protrude into anchoring notches 104 formed on opposite side edges of circuit board 20 at locations corresponding to posts 102 when adaptor tray 92 attaches to the lower side of main assembly 28. Distanced downwardly from posts 102 are forwardly protruding latch 106 and 108 for clinching middle portions of circuit board 20 when they are pressed together. Latch 106 may extend along an arch that conforms to a bent junction 110 of sidewall 36 to the main portion of lower shell 32. The opposite latches 108 may erect upright in parallel with the upright interior surface of thumb grip 18. Both latches 106,108 have inwardly slanted teeth 112 that resiliently ride over the side edges of circuit board 20 before they spring back into locking positions on board 28. The rest of adaptor tray 92 is to help secure the subassembly of circuit board 20 and tray 92 into position onto lower shell 32. To this end, main plate 94 of tray 92 has a pair of parallel side arms 114 at the same side of latch 106 extending in the similar arch thereto. Each arm 114 has a deep lateral cutout 116 to give an enhanced resiliency thereto. On the other hand, lower shell 32 has a pair of blocks 118 formed across junction 110 at the corresponding locations to the outer span of side arms 114. To prevent any longitudinal movements between main assembly 28 and outer sleeve 12, distance between two blocks 117 may be slightly shorter than the outer span of side arms 114 in order to normally urge them toward each other at assembly and thereby restraining main assembly 28 within outer sleeve 12. Across from arms 114 are a pair of upright arms 118 of the similar construction to side arms 114. Like blocks 117, support wall 58 supports two blocks (not shown) formed across the junction between the main body of lower shell 32 in order to resiliently limit arms 118. At least two longitudinal tabs, of which one is shown at 120, are formed, one on sidewall 36 between two blocks 117 of lower shell 32 and the other at the opposite side on support wall 58 to restraint main assembly 28 longitudinally with respect to lower shell 32. When the subassembly of main assembly 28 and adaptor tray 92 is fastened to lower shell 32 and then upper shell 30 is placed.

Thus, all of the components of device 10 are ready to be assembled. First, main assembly 26 with adaptor tray 92 attached may be partially inserted in aperture 68 of thumb grip 18 as they are placed together on lower shell 32. On shell 32 thumb grip 18 is placed with its slider 62 laid on slide rail 59 and base plate 70 centrally aligned with grooves 86. At the same time, main plate 94 of adaptor tray 92 under main assembly 26 is depressed and then locked in position by blocks 117 and tabs 120 of lower shell 32. A circuit board having indents is preferably snapped into place onto the adapter tray. Next, cover plate 78 is pressed onto the interior of thumb grip 18 and clicks into position over latches 76. Finally, upper shell 30 is aligned with lower shell 32 and press fitted thereto with anchor post 55 penetrating columnar seat 56 and cutouts 48 and ridges 54 interlocked together. To achieve a permanent bonding between shells 30 and 32, a controlled amount of strong adhesive may be applied to meeting surfaces of shells 30 and 32 or preferably they can be snapped together. Alternatively, anchor post 55 may be replaced by a screw fastener that can be tightened from outside of lower shell 32 into columnar seat 56 of upper shell 30. While the above method of assembly is one method of assembly, the device can be assembled in a variety of other steps.

Figure 6:
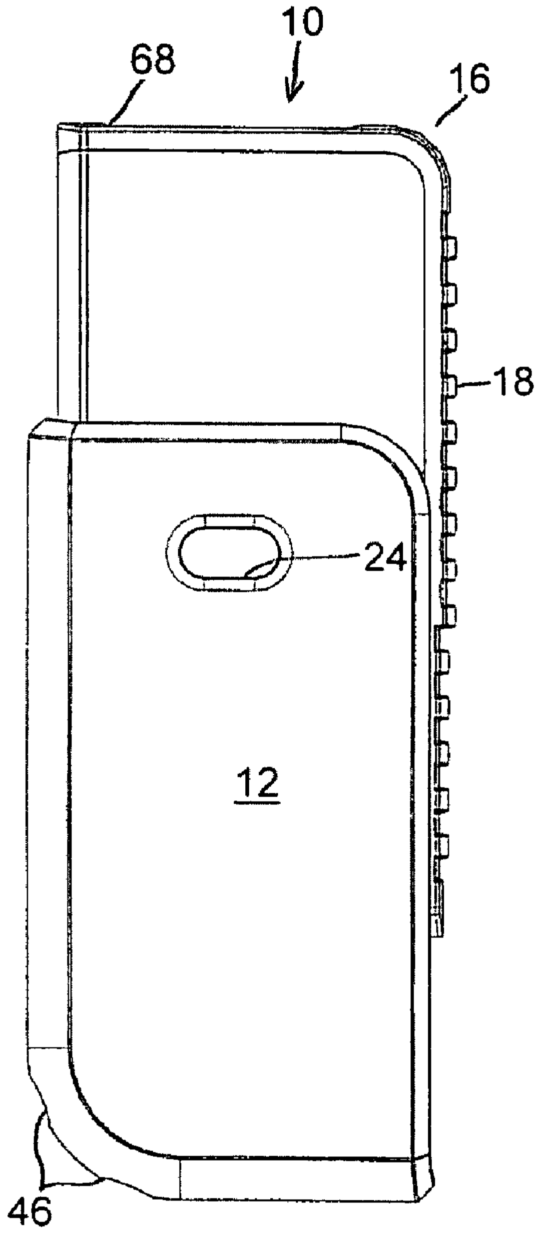
FIG. 6 is a front elevational view of the electronic device in the protective mode.

Thus completed USB device 10 is illustrated in FIG. 6 to show no removable parts exist in the present invention. The device 10 is intuitive for general users to connect and disconnect. No confusing steps are involved but a straightforward activation of thumb grip 18 to immediately start plugging in with the inventive device 10. Actual speed of plugging the device 10 to a host will be faster than any prior sheathed USB connectors because after an initial attempt to slide thumb grip 18 the natural plugging thrust of device 10 will push back inner sleeve 16 resulting in an automatic exposure of the entire USB plug 14 without following up the grip slide.

Figure 7:
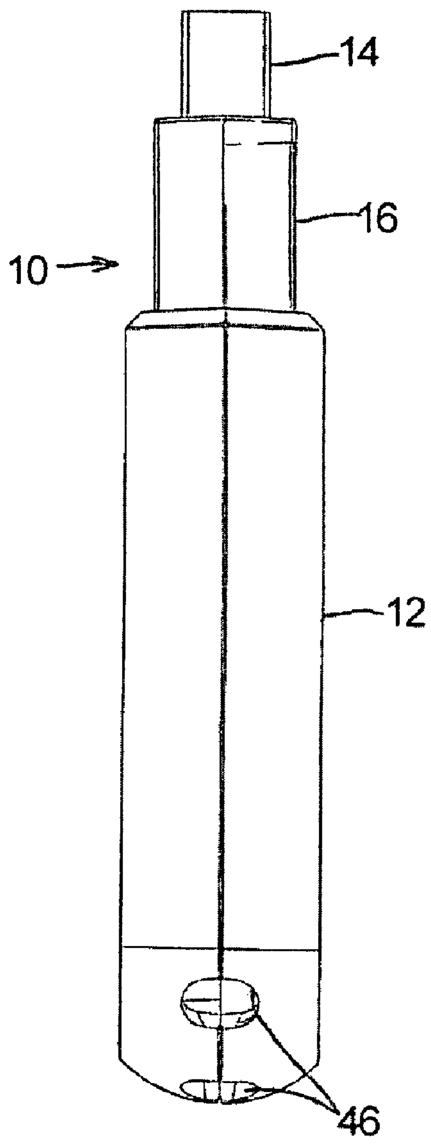
FIG. 7 is left side elevational view of the electronic device with the inner sleeve retracted half way into the base sleeve showing a couple of eyelets in the bottom for lanyard. Similar reference numbers denote corresponding features throughout the attached drawings.

FIG. 7 shows a transitional position of device 10 from left side wherein the completed eyelet 46 is prepared for receiving an optional convenience lanyard. Requiring no small components requiring precision labor but rather only snap together parts, the inventive device 10 is well suited for mass production and reliable light sliding force sleeve retraction usage.

Therefore, while the presently preferred form of the sliding sleeve USB device has been shown and described, and several modifications thereof discussed, persons skilled in this art will readily appreciate that various additional changes and modifications may be made without departing from the spirit of the invention, as defined and differentiated by the following claims. For example, the housing members can be formed as a sleeve, or a wide variety of decorative shapes.

CALL OUT LIST OF ELEMENTS

| | | |
|---|---|---|
| 10: Electronic Device | 12: Outer Sleeve | 14: USB Plug |
| 16: Inner Sleeve | 18: Thumb Grip | 19: Stepped Section |
| 20: Circuit Board | 22, 23: Component Blocks | 24: Viewing Opening |
| 26: Top Surface | 27: LED Lamp | 28: Main Assembly |
| 30: Upper Shell | 32: Lower Shell | 34: Rear Wall |
| 36: Lateral Sidewall | 38: Curved Corner | 40: Lower Round Wall |
| 42: Upper Round Wall | 43, 45: Semicircular Cutout | 46: Eyelet |
| 48: Cutout | 50: Plain Surface | 52: Flat Surface |
| 54: Ridge | 55: Anchor Post | 56: Columnar Seat |
| 58: Support Wall | 59: Slide Rail | 60: Trough |
| 62: T-Slider | 64: End Recess | 66: Exit Gate |
| 68: Large Aperture | 70: Base Plate | 72: End Wall |
| 74: Parting Line | 76: Latch | 78: Cover Plate |
| 79: Overhang | 80: LED | 82: Slotted Arm |
| 84: Elongated Slot | 86: Groove | 88: Slider |
| 90: Dimple Mark | 92: Adaptor Tray | 94: Main Plate |
| 95: Surface Profile | 96: Mount Section | 98: Wide Cavity |
| 100: Upper Side Arm | 102: Upright Post | 104: Notch |
| 106, 108: Latch | 110: Junction | 112: Tooth |
| 114: Side Arm | 116: Lateral Cutout | 117: Block |
| 118: Upright Arm | 120: Tab | |

The invention claimed is:

1. A memory drive comprising:

a. an outside housing;

b. an inside housing that translates relative to the outside housing;

c. a circuit device attached to the outside housing;

d. a memory storage mounted to the circuit device;

e. a USB connector attached to the circuit, wherein the inside housing retracts by sliding to expose the electrical connector; and f. a side opening formed on the outside housing further to expose an exposed portion of the inside housing;

g. a thumb grip formed on the exposed portion of the inside housing; and wherein the top opening and side opening are contiguous.

2. The memory drive of claim 1, further comprising an LED mounted to the circuit, wherein the inside housing covers the LED when the inside housing translates to a retracted position.

3. The memory drive of claim 1, further comprising an LED mounted to the circuit, wherein the inside housing covers the LED when the inside housing translates to an extended position.

4. The memory drive of claim 1, further comprising an LED mounted to the circuit, wherein at least some of the light emitted from the LED is visible through the inside housing.

5. The electronic device of claim 1, further comprising a releasable retainer engaged between the inside housing and outside housing.

6. The memory drive of claim 1, wherein the inside housing is formed as a sleeve.

7. A memory drive comprising:

a. an outside housing having a top opening at a top end and a side opening at a side;

b. an inside housing fitting at least partially within the outside housing, wherein the inside housing translates relative to the outside housing;

c. a circuit device attached to the outside housing and enclosed at least partially within the outside housing;

d. a memory storage mounted to the circuit;

e. a USB connector attached to the circuit and protruding from the top end, wherein the inside housing translates by sliding to selectively cover and expose the electrical connector;

f. a side opening formed on the outside housing further to expose an exposed portion of the inside housing; and g. a thumb grip formed on the exposed portion of the inside housing; and wherein the top opening and side opening are contiguous.

8. The memory drive of claim 7, further comprising a releasable retainer engaged between the inside housing and outside housing.

9. The memory drive of claim 7, wherein the inside housing is formed as a sleeve.

10. A memory drive comprising:

a. an outside housing;

b. an inside housing that translates relative to the outside housing;

c. a circuit device attached to the outside housing via an adaptor tray;

d. a memory storage mounted to the circuit;

e. a USB connector attached to the circuit, wherein the inside housing retracts by sliding to expose the electrical connector f. a side opening formed on the outside housing further to expose an exposed portion of the inside housing; and g. a thumb grip formed on the exposed portion of the inside housing; and wherein the top opening and side opening are contiguous.

11. The memory drive of claim 10, wherein the inside housing is formed as a sleeve.

12. The memory drive of claim 10, further comprising an LED mounted to the circuit, wherein the inside housing covers the LED when the inside housing translates to a retracted position.

13. The memory drive of claim 10, further comprising a releasable retainer engaged between the inside housing and outside housing.

14. The memory drive of claim 10, wherein the adapter tray snaps together with the circuit, wherein the circuit is formed as a printed circuit board.

15. The memory drive of claim 10, wherein the inside housing is formed as a sleeve, further comprising an LED mounted to the circuit, wherein the inside housing covers the LED when the inside housing translates to a retracted position, further comprising a releasable retainer engaged between the inside housing and outside housing.

16. The memory drive of claim 10, wherein the inside housing is formed as a sleeve, further comprising an LED mounted to the circuit, wherein the inside housing covers the LED when the inside housing translates to a retracted position, further comprising a releasable retainer engaged between the inside housing and outside housing, wherein the outside housing further includes a side opening exposing an exposed portion of the inside housing to act as a thumb grip, wherein the adapter tray snaps together with the circuit, wherein the circuit is formed as a printed circuit board.

* * * * *